United States Patent
Solomon et al.

(10) Patent No.: US 7,191,375 B2
(45) Date of Patent: Mar. 13, 2007

(54) METHOD AND APPARATUS FOR SIGNALING AN ERROR CONDITION TO AN AGENT NOT EXPECTING A COMPLETION

(75) Inventors: Gary Solomon, Action, MA (US); David Harriman, Portland, OR (US); Jasmin Ajanovic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 427 days.

(21) Appl. No.: 10/041,040

(22) Filed: Dec. 28, 2001

(65) Prior Publication Data

US 2003/0126535 A1    Jul. 3, 2003

(51) Int. Cl.
*H04L 1/18* (2006.01)
(52) U.S. Cl. ................................ 714/748
(58) Field of Classification Search ........... 714/748, 714/746
See application file for complete search history.

(56) References Cited

U.S. PATENT DOCUMENTS

| | | | |
|---|---|---|---|
| 3,680,058 A | 7/1972 | De Santis | 340/172.5 |
| 3,735,363 A | 5/1973 | Beers | 340/172.5 |
| 4,058,672 A | 11/1977 | Crager | 178/3 |
| 4,464,717 A | 8/1984 | Keeley | 364/200 |
| 4,621,364 A | 11/1986 | Tschoepe | |
| 5,033,047 A | 7/1991 | Uehara | |
| 5,187,780 A | 2/1993 | Clark | 395/325 |
| 5,293,379 A | 3/1994 | Carr et al. | |
| 5,390,298 A | 2/1995 | Kuszmaul et al. | |
| 5,414,717 A | 5/1995 | Matsumoto et al. | |
| 5,522,045 A | 5/1996 | Sandberg | |
| 5,699,519 A | 12/1997 | Shiobara | |
| 5,867,652 A | 2/1999 | Hurvig | |
| 5,909,427 A | 6/1999 | Manning et al. | |

(Continued)

FOREIGN PATENT DOCUMENTS

EP    0 884 880 A2    12/1998

(Continued)

OTHER PUBLICATIONS

Greenwald, M., et al., "Designing an Academic Firewall: Policy, Practice and Experience with SURF", Proceedings of the IEEE Symposium on Network and Distributed System Security (SNDSS '96), San Diego, CA, pp. 79-92 (Feb. 22-23, 1996).

(Continued)

*Primary Examiner*—Albert Decady
*Assistant Examiner*—Esaw Abraham
(74) *Attorney, Agent, or Firm*—Ted A. Crawford

(57) ABSTRACT

A transmitting device and a receiving device are coupled via a high-speed serial interface within a computer system. The transmitting device transmits a packet for a request transaction to a receiving device. The receiving device checks for error conditions. If an error condition exists and if the packet for the request transaction indicates that a completion is not expected by the transmitting device, an error message is delivered by the receiving device to the transmitting device.

15 Claims, 11 Drawing Sheets

U.S. PATENT DOCUMENTS

| | | |
|---|---|---|
| 5,920,705 A | 7/1999 | Lyon et al. |
| 5,968,197 A * | 10/1999 | Doiron ...................... 714/748 |
| 6,055,236 A | 4/2000 | Nessett et al. |
| 6,084,869 A | 7/2000 | Fishman et al. |
| 6,154,839 A | 11/2000 | Arrow et al. |
| 6,359,877 B1 * | 3/2002 | Rathonyi et al. ........... 370/349 |
| 6,389,016 B1 | 5/2002 | Sabaa et al. |
| 6,395,637 B1 | 5/2002 | Park et al. |
| 6,424,625 B1 | 7/2002 | Larsson et al. |
| 6,493,343 B1 | 12/2002 | Garcia et al. |
| 6,515,967 B1 | 2/2003 | Wei et al. |
| 6,519,731 B1 * | 2/2003 | Huang et al. ............... 714/751 |
| 6,622,187 B1 | 9/2003 | Brune ....................... 710/100 |
| 6,690,648 B2 | 2/2004 | Niida ........................ 370/236 |
| 6,691,192 B2 | 2/2004 | Ajanovic ................... 710/107 |
| 6,694,440 B1 | 2/2004 | Ishibashi ................... 713/310 |
| 6,760,307 B2 * | 7/2004 | Dunning et al. ............ 370/231 |
| 2002/0122411 A1 | 9/2002 | Zimmerman |
| 2003/0031208 A1 | 2/2003 | Anehem et al. |
| 2003/0039209 A1 | 2/2003 | Webber |

FOREIGN PATENT DOCUMENTS

EP      0 967 757 A2     12/1999

OTHER PUBLICATIONS

HyperTransport Technology Consortium, "HyperTransport I/O Link Specification", Revision 1.03, Chapter 10, pp. 111-118 (Oct. 10, 2001).

IBM Corporation, "Deadlock-Free Message Passing Protocol in CSP-Based Languages", IBM Technical Disclosure Bulletin, vol. 37, No. 7, pp. 192-195 (Dec. 1989).

Mitra, N., "Efficient Encoding Rules for ASN/1-Based Protocols", AT&T Technical Journal, vol. 73, No. 3, New York, US, pp. 80-93 (May/Jun. 1994).

Defense Advanced Research Projects Agency, "RFC 791", Sep. 1981.

Shanley, Ton, "PCI-X System Architecture", Mindshare, Inc., Addison-Wesley, Nov. 21, 2000.

* cited by examiner

| | 0 | | | | | | | | 1 | | | | | | | | 2 | | | | | | | | 3 | | | | | | | |
|---|---|---|---|---|---|---|---|---|---|---|---|---|---|---|---|---|---|---|---|---|---|---|---|---|---|---|---|---|---|---|---|---|
| | 7 | 6 | 5 | 4 | 3 | 2 | 1 | 0 | 7 | 6 | 5 | 4 | 3 | 2 | 1 | 0 | 7 | 6 | 5 | 4 | 3 | 2 | 1 | 0 | 7 | 6 | 5 | 4 | 3 | 2 | 1 | 0 |
| Byte 0 > | X01 | | | Type | | | Et | | 00000000 | | | | | | | | | | | | | | | | 0000 | | | | 1st DW BE | | | |
| Byte 4 > | | | | Ext. Reg. Address | | | | | Bus Number | | | | | | | | Device Number | | | | | Func. No. | | | Register Number | | | | | | | |
| Byte 8 > | Requester ID | | | | | | | | | | | | | | | | Tag | | | | | | | | Virtual Channel ID | | | | | | | |

Figure 7

| | 0 | | | | | | | | 1 | | | | | | | | 2 | | | | | | | | 3 | | | | | | | |
|---|---|---|---|---|---|---|---|---|---|---|---|---|---|---|---|---|---|---|---|---|---|---|---|---|---|---|---|---|---|---|---|---|
| | 7 | 6 | 5 | 4 | 3 | 2 | 1 | 0 | 7 | 6 | 5 | 4 | 3 | 2 | 1 | 0 | 7 | 6 | 5 | 4 | 3 | 2 | 1 | 0 | 7 | 6 | 5 | 4 | 3 | 2 | 1 | 0 |
| Byte 0 > | X01 | | | Type | | | Et/El | | Length | | | | | | | | Attributes | | | | | | | | Compl. Status | | | | | | | |
| Byte 4 > | Completer ID | | | | | | | | | | | | | | | | | | | | | | | | | | | | | | | |
| Byte 8 > | Requester ID | | | | | | | | | | | | | | | | Tag | | | | | | | | Virtual Channel ID | | | | | | | |

METHOD AND APPARATUS FOR SIGNALING AN ERROR CONDITION TO AN AGENT NOT EXPECTING A COMPLETION

Reference is made to the commonly assigned co-pending patent applications Ser. No. 10/040,605, entitled "Communicating Transaction Types Between Agents in a Computer System Using Packet Headers Including Format and Type Fields"; Ser. No. 10/041,028, entitled "Communicating Transaction Types Between Agents in a Computer System Using Packet Headers Including an Extended Type/Extended Length"; Ser. No. 10/040,765, entitled "Communicating Message Request Transaction Types Between Agents in a Computer System Using Multiple Message Groups"; and Ser. No. 10/040,702, entitled "Method for Handling Unexpected Completion Packets and Completion Packets With a Non-Successful Completion Status."

FIELD OF THE INVENTION

The present invention pertains to the field of computer systems. More particularly, this invention pertains to the field of high speed point-to-point interconnections and communications architectures.

BACKGROUND OF THE INVENTION

Computing appliances, e.g., computer systems, servers, networking switches and routers, wireless communication devices, and the like are typically comprised of a number of disparate elements. Such elements often include a processor, system control logic, a memory system, input and output interfaces, and the like. To facilitate communication between such elements, computing appliances have long relied on general purpose input/output busses to enable these disparate elements of the computing system to communicate with one another in support of the myriad of applications offered by such appliances.

Perhaps one of the most pervasive of such general purpose bus architectures is the Peripheral Component Interconnect (PCI) bus. The PCI bus standard (Peripheral Component Interconnect (PCI) Local Bus Specification, Rev. 2.2, released Dec. 18, 1998) defines a multi-drop, parallel bus architecture for interconnecting chips, expansion boards, and processor/memory subsystems in an arbitrated fashion within a computing appliance. While typical PCI bus implementations have a theoretical 133 Mbytes per second throughput (i.e., 32 bits at 33 MHz), the PCI 2.2 standard allows for 64 bits clocked at up to 133 MHz The throughput provided by the PCI bus architectures has, until recently, provided adequate bandwidth to accommodate the internal communication needs of even the most advanced of computing appliances (e.g., multiprocessor server applications, network appliances, etc.). However, recent advances in processing power and increasing input/output bandwidth demands create a situation where prior general purpose architectures such as the PCI bus architecture have become processing bottlenecks within such computing appliances.

Another limitation associated with prior architectures is that they are typically not well-suited to process isochronous (time dependent) data streams. An example of an isochronous data stream is a multimedia data stream which requires a transport mechanism to ensure that the data is consumed as fast as it is received and to ensure that the audio portion is synchronized with the video portion. Conventional general purpose input/output architectures process data asynchronously, or in random intervals as bandwidth permits. Such asynchronous processing of multimedia streams data can result in lost data and/or misaligned audio and video.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

FIG. 7 is a diagram showing a request header format for a configuration transaction.

FIG. 8 is a diagram showing one embodiment of a format for a completion header.

DETAILED DESCRIPTION

Described below are embodiments of a point-to-point packet-based interconnection architecture, communication protocol and related methods to provide a scalable and extensible general input/output communication platform for deployment within an electronic appliance. The disclosed embodiments involve an enhanced general input/output interconnection architecture and associated communications protocol. One example embodiment includes one or more of a root complex including a host bridge, a switch, or endpoints, each incorporating at least a subset of enhanced general input/output features to support enhanced general input/output communication between such elements.

Communication between the enhanced general input/output facilities of such elements is performed in one embodiment using serial communication channels employing a communication protocol which supports one or more innovative features including, but not limited to, virtual communication channels, tailer-based error forwarding ("tailers" are appended to transaction layer packets to indicate an error condition), support for legacy PCI-based devices, multiple request response types, flow control and/or data integrity management facilities. The communication protocol supported in this embodiment includes a communication protocol stack including a physical layer, a data link layer and a transaction layer.

In an alternate embodiment, a communications agent incorporates an enhanced general input/output engine comprising a subset of the foregoing features. Further, one or more elements of the various embodiments may be implemented in hardware, software, a propagated signal, or a combination thereof.

Figure 1:
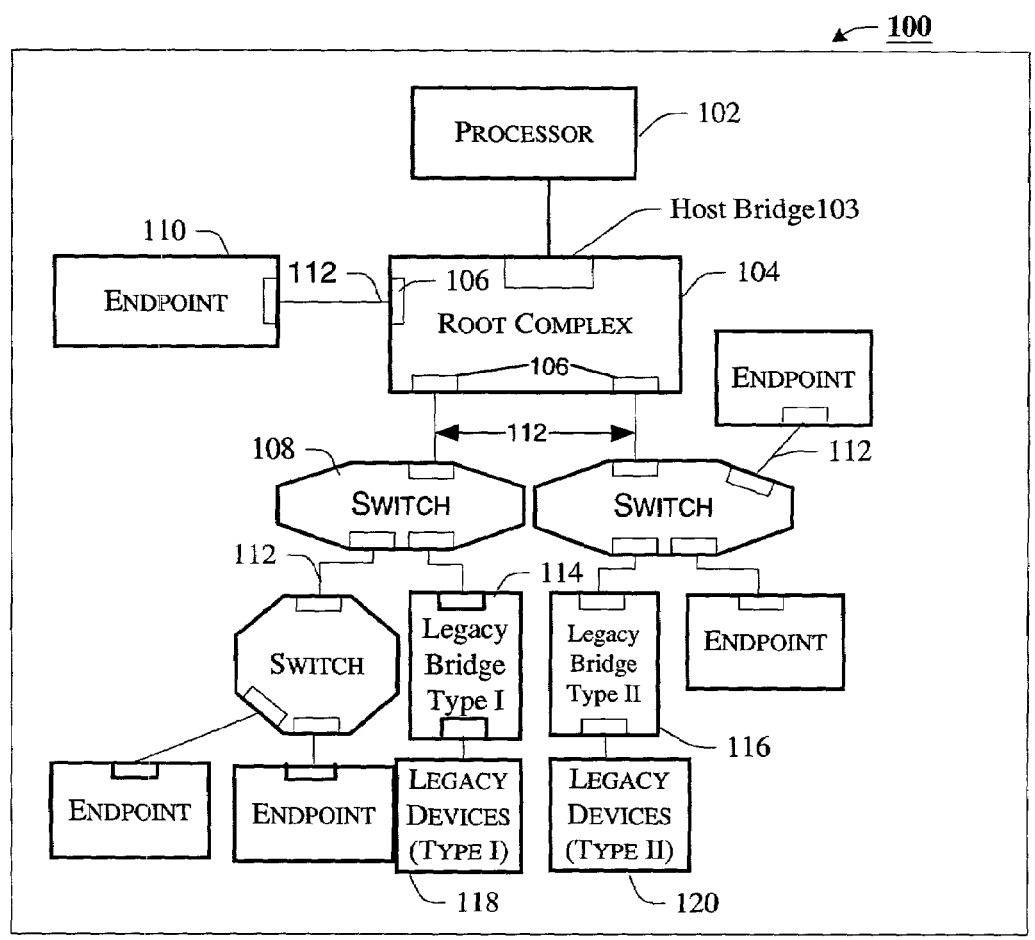
FIG. 1 is a block diagram of one embodiment of a computer system.

FIG. 1 is a block diagram of an electronic appliance 100, which, for this embodiment, is a computer system. The system 100 includes a processor 102, a host bridge 103 included as part of a root complex 104, switch 108 and endpoint 110, each coupled as shown. The root complex 104, switch 108, and endpoint 110 include one or more instances of an enhanced general input/output communication port 106. As shown, each of the elements 102, 104, 108 and 110 are coupled to at least one other element through a communication link 112 supporting one or more enhanced general input/output communication channels via the enhanced general input/output communication port. The system 100 is intended to represent any of a wide variety of traditional and non-traditional computing systems, servers, network switches, network routers, wireless communication subscriber units, wireless communication telephony infrastructure elements, personal digital assistants, set-top boxes, or any electric appliance that would benefit from the communication resources introduced through integration of at least a subset of the enhanced general input/output interconnection architecture and/or communications protocol described herein.

In this example embodiment, processor 102 controls one or more aspects of the functional capability of the electronic appliance 100. In this regard, the processor 102 is representative of any of a wide variety of control logic devices including, but not limited to, one or more of a microprocessor, a programmable logic device (PLD), programmable logic array (PLA), application specific integrated circuit (ASIC), a microcontroller, and the like.

The root complex 104 provides a communications interface between the processor 102 and the switch 108 and endpoint 110. As used herein, the term "root complex" refers to a logical entity of an enhanced general input/output hierarchy that is closest to a host controller, a memory controller hub, an IO controller hub, or any combination of the above, or some combination of chipset/CPU elements (i.e., in a computing system environment). Although depicted in FIG. 1 as a single unit, the root complex 104 may be implemented with multiple physical components. The root complex 104 is populated with one or more enhanced general input/output ports 106 to facilitate communication with other peripheral devices, e.g., the switch 108, endpoint 110 and, although not particularly depicted, the legacy bridges 114, or 116. In one embodiment, each enhanced general input/output interface port represents a different hierarchy domain. In this regard, the embodiment of FIG. 1 denotes a root complex 104 with three hierarchy domains.

Figure 2:
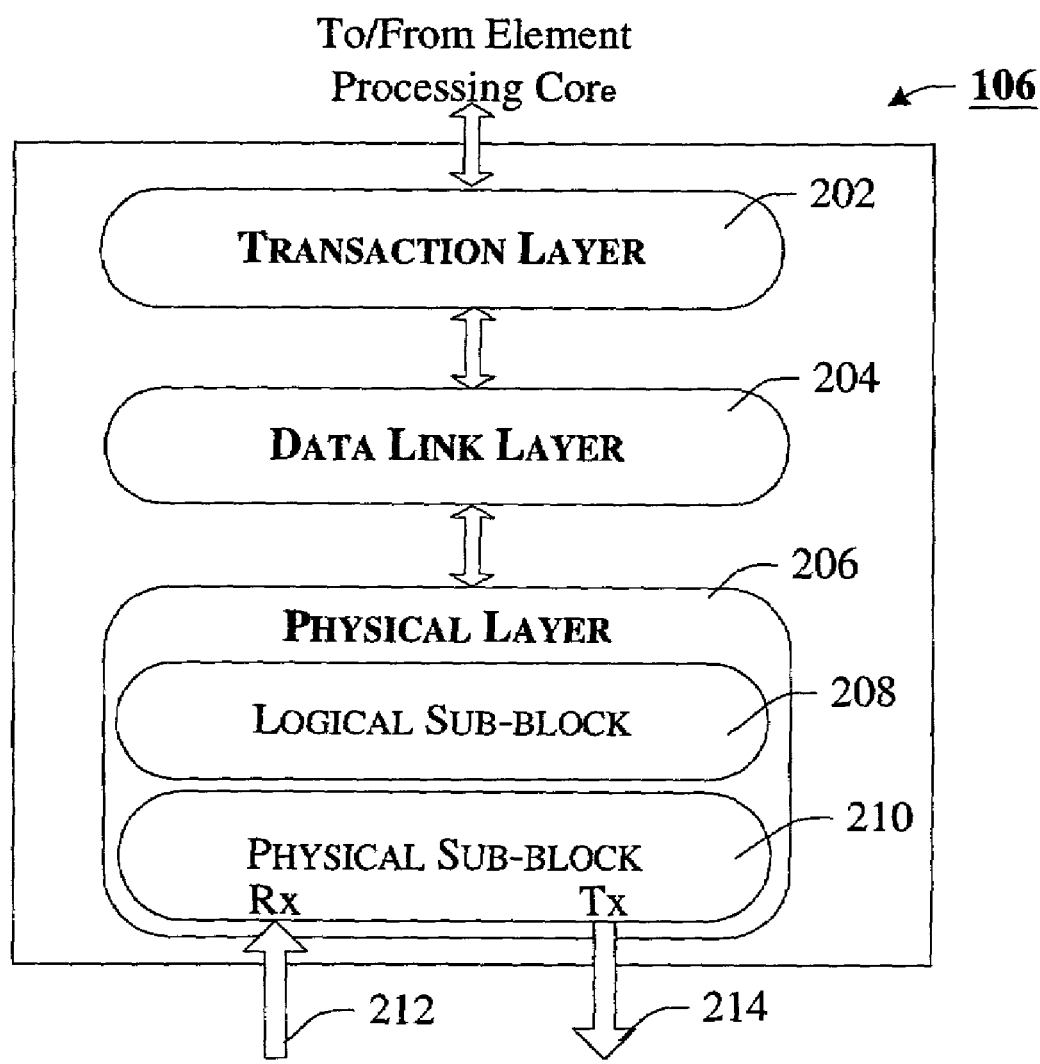
FIG. 2 is a graphical illustration of an example enhanced general input/output port.

FIG. 2 is a graphical illustration of an example enhanced general input/output port 106. In this embodiment, the enhanced general input/output port 106 implements a communication stack comprising a transaction layer 202, a data link layer 204 and a physical layer 206 including a logical sub-block 208, and a physical sub-block 210, as shown. Elements of the transaction layer will be discussed below in more detail.

The transaction layer 202 provides an interface between the enhanced general input/output architecture and a device core. A primary responsibility of the transaction laser 202 is the assembly and disassembly of packets for one or more logical devices within an agent.

One of the primary goals of the enhanced general input/output architecture is to maximize the efficiency of communication between devices. In one embodiment, the transaction layer implements a pipelined full split-transaction protocol as well as mechanisms for differentiating the ordering and processing requirements of transaction layer packets. The transaction layer further comprehends transaction layer packet construction and processing.

One embodiment of the enhanced general input/output architecture supports the following basic transaction types and address spaces: Memory, I/O, Configuration, and Message. Two addressing types are supported: 32 bit and 64 bit.

Transactions are carried using Request and Completion packets, which may be referred to simply as Requests and Completions. Completions are used only where required, e.g.: to return read data, or to acknowledge completion of I/O and configuration write transactions. Completions are associated with their corresponding Requests by the value in the Requester ID field of the packet header (discussed below).

All transaction layer packets in this embodiment start with a defined header. Some transaction layer packets include data following the header as determined by the format field specified in the transaction layer packet header. The transaction layer packet is limited in size by a predetermined maximum payload size value. The transaction layer packet data in this embodiment is four-byte naturally aligned and in increments of four-byte double-words.

Figure 3:
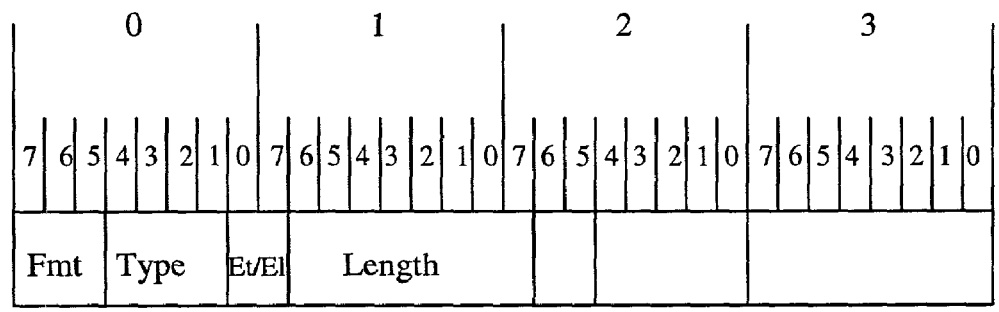
FIG. 3 is a diagram showing the format of one embodiment of the start of a transaction layer packet header.

FIG. 3 is a diagram showing the format of one embodiment of the start of a transaction layer packet header. Each transaction layer packet header includes a three-bit format field (Fmt[2:0]). The transaction layer packet header also includes a four-bit type field (Type[3:0]). Both the Fmt and Type fields need to be decoded in order to determine the transaction layer packet format. Table 1 below shows example encodings for the Fmt field.

TABLE 1

| Fmt Field Encodings | |
|---|---|
| 000 | 2 double-word header, no data |
| 001 | 3 double-word header, no data |
| 010 | 4 double-word header, no data |
| 101 | 3 double-word header, with data |
| 110 | 4 double-word header, with data |

The transaction layer header for this embodiment also includes a two-bit Extended Type/Extended Length field (Et/El). This field is used to extend either the Type field or the Length field, depending on the value in the Type field. The Length field for this embodiment is ordinarily an eight-bit field, but may be extended to become a ten-bit field if the value in the Type field indicates that the Et/El field is to be used to extend the Length field. The Type field can be extended to become a six-bit field by appending the Et/El field, depending on the value in the Type[3:0] field. See Table 2 below for example Fmt, Type, and Et/El field encodings (alternative embodiments may use other encoding schemes). The Et/El field is used as an extension of the Type field except where noted.

TABLE 2

Fmt, Type, and Et/El Encodings

| Packet Type | Fmt[2:0] | Type[3:0] | Et/El[1:0] | Description |
|---|---|---|---|---|
| MRd | 001 010 | 1001 | E19 E18 | Memory Read Request Et/El field used for Length[9:8] |
| MRdLk | 001 010 | 1011 | 00 | Memory Read Request-Locked |
| MWr | 101 110 | 0001 | E19 E18 | Memory Write Request-Posted Et/El field used for Length[9:8] |
| IORd | 001 | 1010 | 00 | IO Read Request |
| IOWr | 101 | 1010 | 00 | IO Write Request |
| CfgRd0 | 001 | 1010 | 01 | Configuration Read Type 0 |
| CfgWr0 | 101 | 1010 | 01 | Configuration Write Type 0 |
| CfgRd1 | 001 | 1010 | 11 | Configuration Read Type 1 |
| CfgWr1 | 101 | 1010 | 11 | Configuration Write Type 1 |
| Msg | 010 | 011$s_2$ | $s_1 s_0$ | Message Request-The sub-field s[2:0] specifies a group of messages. The Message field must be decoded to determine specific cycle including if a Completion is required or not. |
| MsgD | 110 | 011$s_2$ | $s_1 s_0$ | Message Request with Data-The sub-field s [2:0] specifies a group of messages. The Message field must be decoded to determine specific cycle including if a Completion is required or not. |
| MsgComm | 110 | 110$c_2$ | $c_1 c_0$ | Message for Advanced Switching-The sub-field c[2:0] specifies the message type: 000-Unicast, Data Packet 001-Multicast, Data Packet 010-Signaling Packet, without interrupt 011-Reserved 100-Null signaling Packet, interrupt to Host in the destination Hierarchy 101-Null signaling Packet, interrupt to destination device 110-Signaling Packet, with interrupt to Host in the destination Hierarchy 111-Signaling Packet, with interrupt to destination device |
| Cpl | 001 | 0100 | 00 | Completion without Data-used for IO and Configuration Write Completions, and Memory Read Completions with Completion Status other than "Successful Completion." |
| CplD | 101 | 0100 | E19 E18 | Completion with Data-used for Memory, IO, and Configuration Read Completions Et/El field used for Length[9:8] |
| CplDLk | 101 | 0101 | 01 | Completion for Locked Memory Read |

Request packets include a Request Header which for some types of Request packets will be followed by some number of double-words of data. The term "double-word" as used herein indicates a 32-bit length of data. For this example embodiment, the Length field for Message Request Headers is not used except for Messages that explicitly refer to a data length. Also for this embodiment, for Memory Read Requests and Memory Write Requests, the El/Et field is concatenated with the Length field to form a ten-bit length field. The ten-bit length field allows read and write requests indicating up to 4 kB of data. Other types of transaction layer packets are limited by the size of the Length[7:0] field to indicating up to 1 kB of data. The amount of data included in any transaction layer packet is limited in one embodiment to a predetermined maximum payload size. For transaction layer packets that include data, the value in the Length field and the actual amount of data should be equal. If the receiver determines that the Length field value and the actual amount of data do not match, then the packet is treated as a Malformed Transaction Layer Packet. Malformed Transaction Layer Packets are described below.

Figure 4:
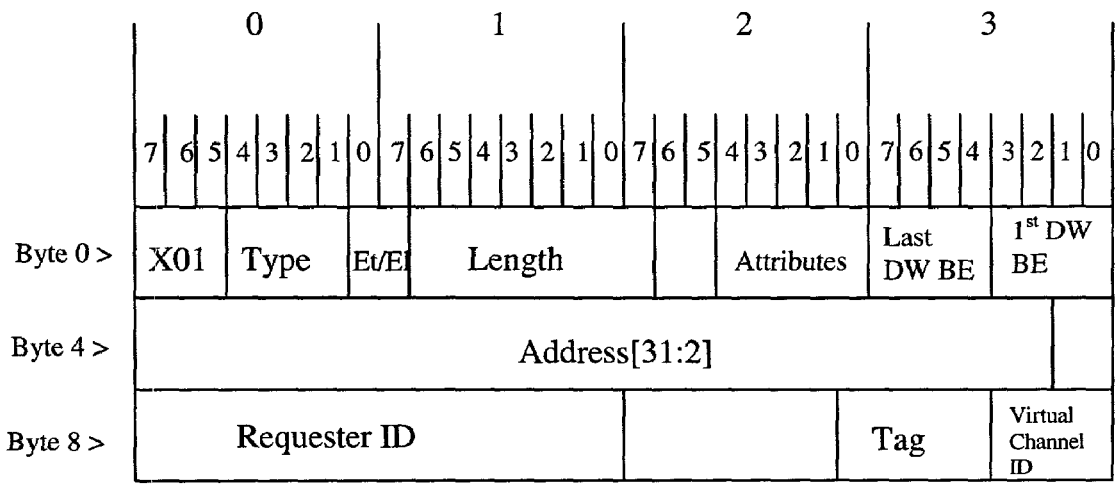
FIG. 4 is a diagram of a request packet header supporting a 32-bit address format.
Figure 5:
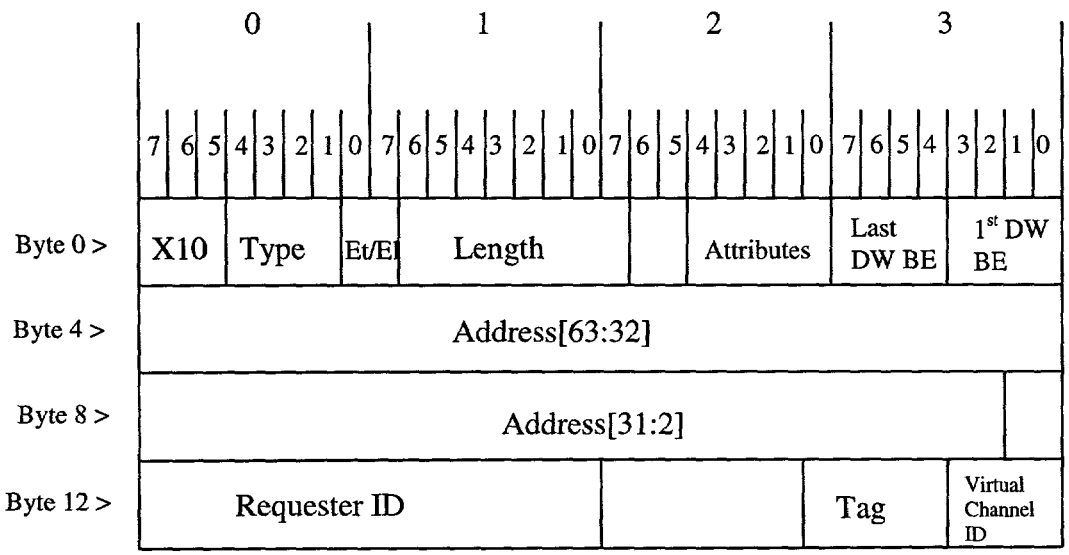
FIG. 5 is a diagram of a request packet header supporting a 64-bit address format.

FIG. 4 is a diagram of a request packet header supporting a 32-bit address format and FIG. 5 is a diagram of a request packet header supporting a 64-bit address format. For one embodiment, memory read requests and memory write requests case use either the 32-bit address format or the 64-bit address format. For addresses below 4 GB, the 32-bit format is used.

The request packet headers of FIGS. 4 and 5 also include a First Double Word Byte Enable field (1st DW BE) and a Last Double Word Byte Enable field (Last DW BE). The First Double Word Byte Enable field contains byte enables for the first double word of any memory read or write request. This field also contains byte enables for the only double word of an input/output or configuration request. The Last Double Word Byte Enable field contains byte enables for the last double word of any memory read or write request. The byte enable fields are not used with Messages because these fields overlap the message code field for a message request header (See FIG. 7, discussed below).

For one embodiment, for each bit in the byte enable fields, a value of "0" indicates that the corresponding byte of data is not written or, if non-prefetchable, read at a completor. The term "completer" as used herein is meant to indicate a logical device addressed by a request packet header. A value of "1" indicates that the corresponding byte of data is written or, if non-prefetchable, read at the completer. For the First Double Word Byte Enables field, bit 0 corresponds to byte 0 of the first double word of data. Bit 1 corresponds to byte 1 of the first double word of data. Bit 2 corresponds to byte 2 of the first double word of data. Bit 3 corresponds to byte 3 of the first double word of data. For the Last Double Word Byte Enables field, bit 0 corresponds to byte 0 of the last double word of data. Bit 1 corresponds to byte 1 of the last double word of data. Bit 2 corresponds to byte 2 of the last double word of data. Bit 3 corresponds to byte 3 of the last double word of data.

The example packet headers of FIGS. 4, 5, 6, and 8 include a Requestor ID field, a Tag field, an Attribute field, and a Virtual Channel ID field. The Requestor ID field and the Tag field together form a Transaction ID field. The Requestor ID field is divided into a Bus Number field, a Device Number field, and a Function Number field.

The Tag field is a 5-bit field generated by each requesting device. The tag value is unique for all outstanding requests that require a completion for that requesting device. The Transaction ID field is included with all Requests and Completions. The Requestor ID field for these example embodiments is a 16-bit value that is unique for every function (a function is one independent section of a multi-function device identified in configuration space by a unique function number). Functions capture the Bus Number supplied with all configuration writes completed by the function, and supply this number in the Bus Number section of the Requestor ID field. Each logical device in a component is designed to respond to a unique Device Number for configuration requests addressing that component. For these example embodiments a component may contain many (perhaps up to several dozen) logical devices. Each function associated with a logical device in a component is designed to respond to a unique function number for configuration requests addressing that component and logical device. Each logical device may contain up to eight logical functions.

The Attributes field specifies characteristics of the transaction. Attributes that may be specified in the attributes field include a priority attribute, transaction ordering attributes, and cache coherency management attributes.

The Virtual Channel ID field identifies the virtual channel. For these example embodiments, the Virtual Channel ID field is a 4-bit field that allows identification of up to 16 virtual channels on a per transaction basis. For these example embodiments, virtual channel 0 is used for general purpose traffic and a virtual channel other than 0 is used for isochronous traffic.

Figure 6:
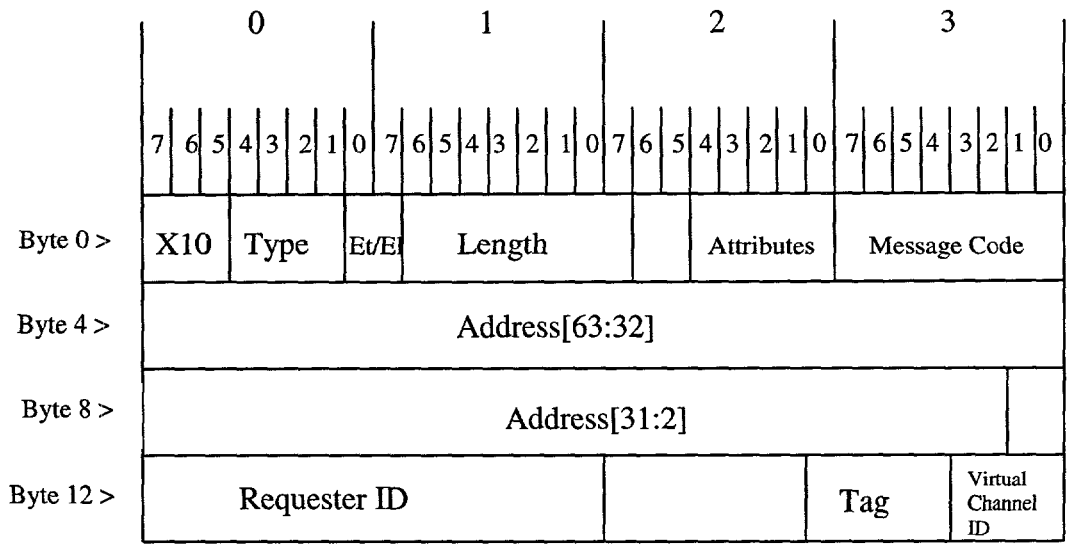
FIG. 6 is a diagram of a packet header for a Message.

FIG. 6 is a diagram of a packet header for a Message. As seen in Table 2, messages may or may not include data and may or may not require completion. Messages are decoded by all devices in a system that support the enhanced general input/output interconnection architecture.

For message requests, the Message field is decoded in order to determine the specific cycle and to determine whether the message includes data and whether the message requires completion. The Message field for this embodiment is an 8-bit field located where the byte enable fields normally reside for other transaction types. Unsupported messages are treated by the receiving device as no-completion-required (no-completion-required transactions discussed below).

Messages for this example embodiment are divided into groups. There are eight groups that include data with the request and eight groups that do not. Other embodiments are possible using different numbers of groups. For this embodiment, as shown in Table 2, the eight groups that include data with the requests have a value of b110 in the Fmt field. The eight groups that do not include data have a value of b010 in the Fmt field. The sub-field s[2:0] incorporates one bit from the Type field and the two bits from the Et/El field. The sub-field s[2:0] indicates one of eight groups.

Examples of various messages that may be implemented include, but are not limited to, the following: messages for unlocking devices; messages for resetting devices; messages indicating a correctable error condition; messages indicating an uncorrectable error condition; messages indicating a fatal error condition; messages used to report bad request packets; messages relating to power management; messages related to ordering control/management; and messages for emulating legacy (e.g., PCI) interrupt signals (or other legacy signals). These various message types can be subdivided into one of the previously discussed groups. For example, all of the power management messages may be included in one group and the interrupt signaling messages may be included in another.

FIG. 7 is a diagram showing a request header format for a configuration transaction. The configuration space is one of the four supported address spaces for these example embodiments.

FIG. 8 is a diagram showing one embodiment of a format for a completion header. All read requests and some write requests require completion. Completions include a completion header that, for some types of completions, are followed by some number of double-words of data. The Completion Status[2:0] field shown in FIG. 8 indicates the status for a completion. Table 3 shows one example encoding scheme.

TABLE 3

Completion Status Field Encoding Scheme

| Completion Status[2:0] | Status |
|---|---|
| 000 | Successful Completion |
| 001 | Unsupported Request-Expecting Completion |
| 011 | Reserved |
| 100 | Completer Abort |

The Completer ID[15:0] field contains the same type of information as the Requestor ID field described above. The value provided in the Completer ID field corresponds to the bus/device/function of the agent that completes the request. Completion headers contain the same values for Requester ID, Tag, and Channel ID as were supplied in the header of the request packet. Completion headers also contain the same value in the Attribute field as was initially supplied with the header of the request. Completion packets are routed by switches and root complexes to the port that initiated the corresponding request transaction.

For memory read request transactions, individual completion packets may provide less than the full amount of data requested by the corresponding read request so long as all of the completion packets associated with the corresponding read request, when combined, return the amount of data specified. For these example embodiments, I/O and Configuration read requests are completed with exactly one completion packet.

A completion that includes data specifies the amount of data in the packet header. If the completion packet actually contains an amount of data that differs from the specified amount, a malformed transaction layer packet results.

Figure 9A:
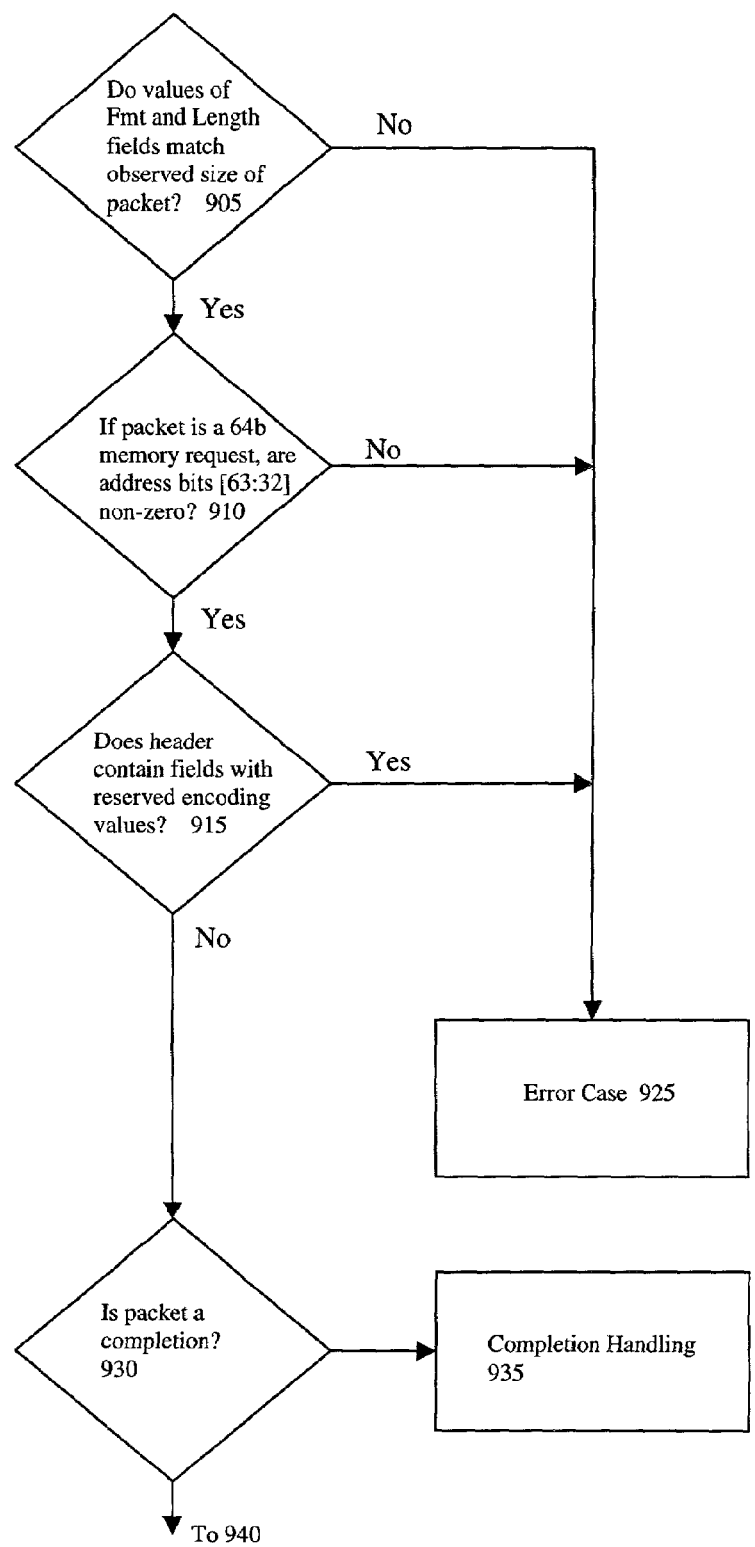
FIGS. 9a and 9b combined form a flow diagram of an example embodiment of a method for handling received transaction layer packets.
Figure 9B:
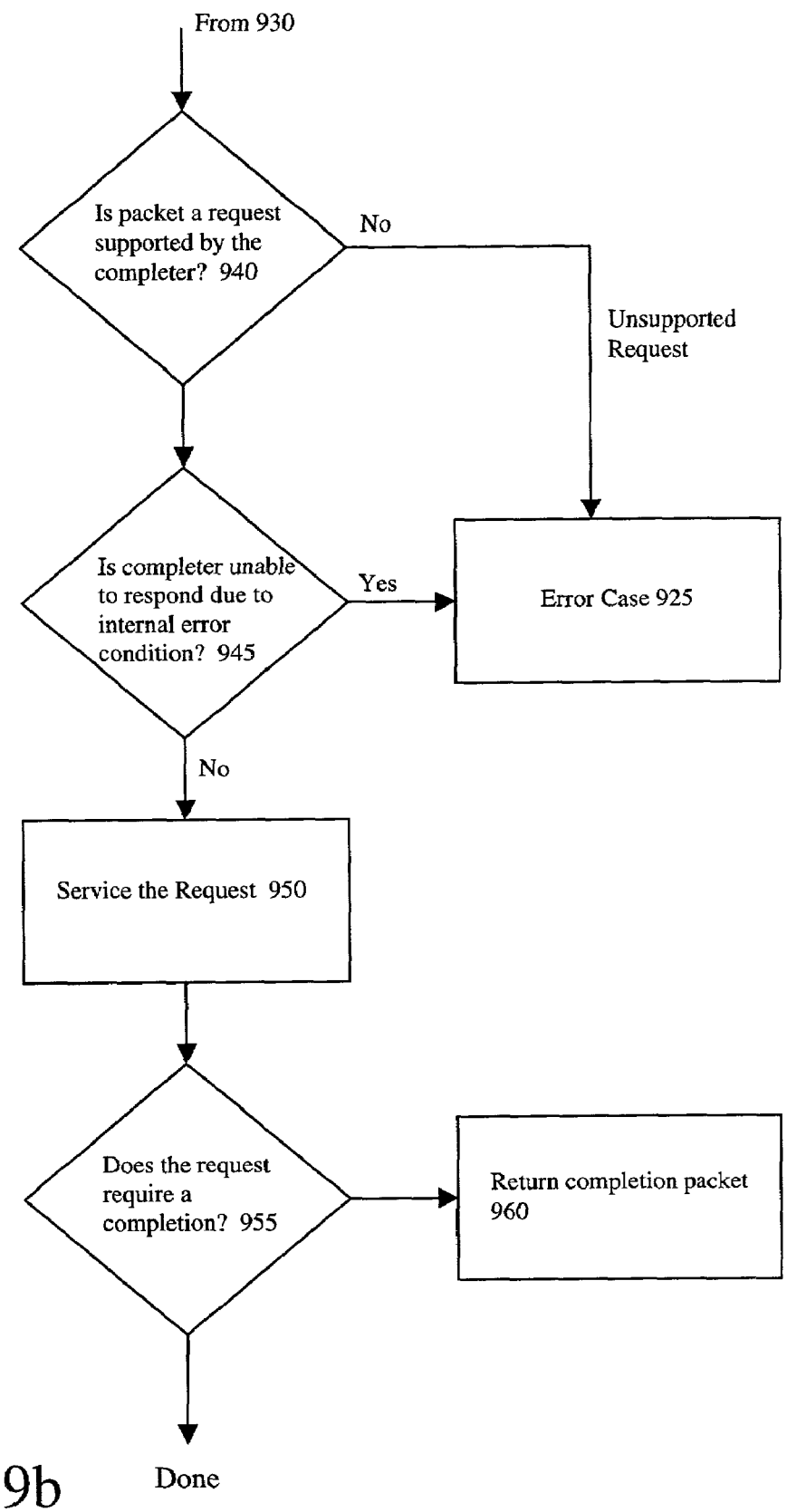

FIGS. 9*a* and 9*b* combined form a flow diagram of an example embodiment of a method for handling received transaction layer packets. The operations described below do not necessarily need to occur in a serial fashion. Some embodiments may perform some operations simultaneously. At block 905, a check is made to determine whether the values contained in the Fmt and Length fields of the received packet match the actual size of the packet. A mismatch indicates a malformed packet and an error case results as shown at block 925. Error case handling will be discussed below. If the actual size of the received packet does not indicate a mismatch with the Fmt and Length fields, then processing continues at block 910.

If the received packet is a memory request using 64 bit addressing, then at block 910 the address bits [63:32] are checked to see whether any of the address bits [63:32] are non-zero. If none of the address bits [63:32] are non-zero, then the result is a malformed packet and processing proceeds to the error case block 925. If at least one of the address bits [63:32] are non-zero, then processing continues at block 915.

At block 915, a check is made to determine whether any fields in the packet header contain reserved values. If reserved values are found, then the result is an malformed packet and processing proceeds to block 925. If no reserved values are found, then processing continues at block 930.

At block 930, a determination is made as to whether the packet is a request packet or a completion packet. If the packet is a completion packet, then processing proceeds to the completion handling block 935. Completion handling will be discussed more fully below. If the received packet is not a completion packet, then processing continues at block 940. Note that all packets that flow to block 940 are request packets.

At block 940, a check is made to determine whether the request packet is a request type that is supported by the completing device. If the request type is not supported, then the result is an unsupported request and processing proceeds to the error case block 925. For this example embodiment, if the unsupported request type is a broadcast message or a message using an encoding reserved for broadcast messages, then the packet is silently dropped and no error case results. If the request type is supported by the completing device, then processing continues at block 945.

If, as shown at block 945, the completing device is unable to respond to the request packet due to an internal error, then the result is a "completer abort" and processing proceeds to error case block 925. Otherwise, the request is serviced at block 950. In servicing the request, it may be necessary to repeat the processing indicated by blocks 940 and 945.

Once the request is serviced successfully, then processing continues at block 955. As indicated by block 955, if the processed request requires a completion, then a completion packet is returned at block 960.

Figure 10:
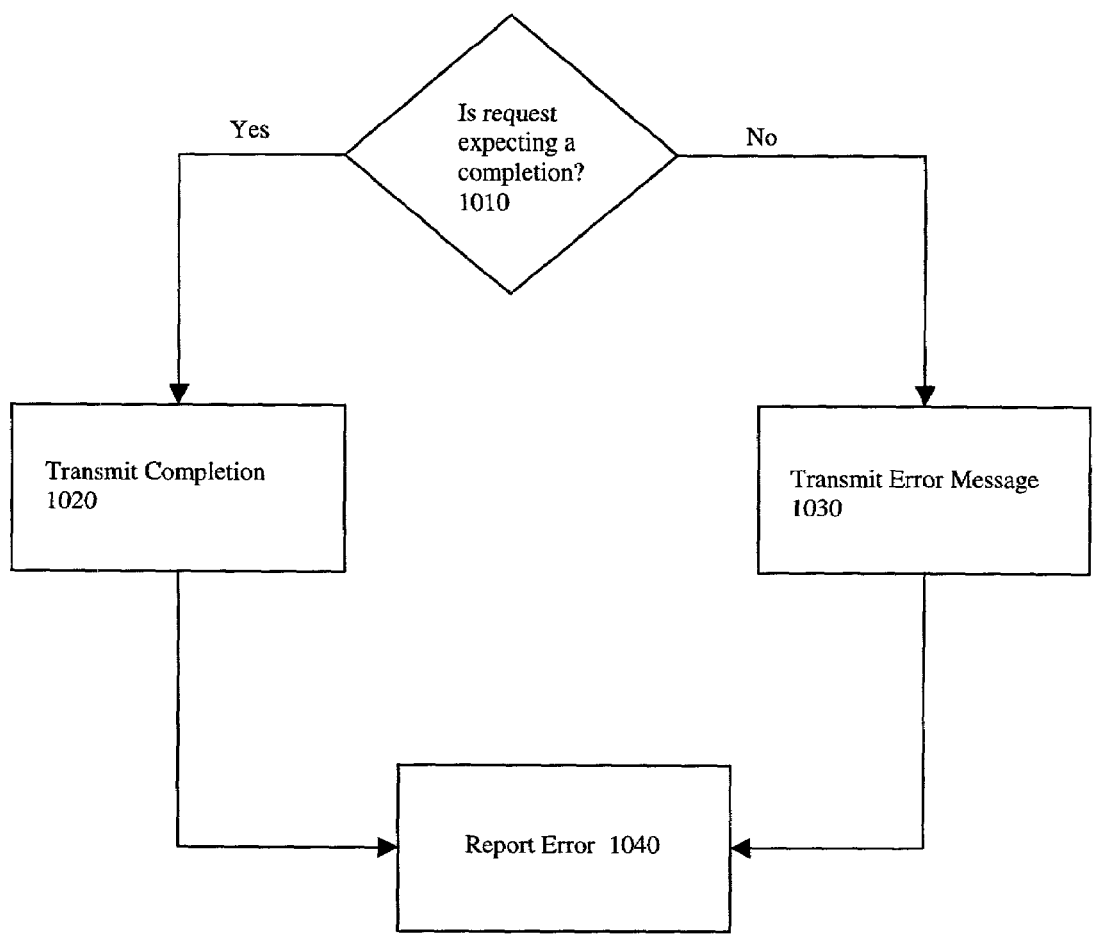
FIG. 10 is a flow diagram of one embodiment of a method for handling error conditions associated with received request packets.

FIG. 10 is a flow diagram of one embodiment of a method for handling error conditions associated with received request packets. As seen at block 1010, if the received request is expecting a completion, then a completion with the appropriate completion status is transmitted at block 1020. The completion is routed back to the requesting device. If the received request is not expecting a completion, then an error message is transmitted to the requesting device at block 1030. The error is reported to the system at block 1040. The error message transmitting operating denoted at block 1030 may be implemented as a programmable option.

Some systems may include one or more PCI buses in addition to the previously discussed enhanced general input/output interconnection architecture. For memory, I/O, and configuration requests traveling through the enhanced general input/output interconnection architecture and destined to a device on a PCI bus, the completion status for these embodiments represents the actual PCI termination for the cycle. For example, a non-posted PCI cycle must actually be serviced on the PCI bus before a completion status can be determined. For all other cases, the completion status values are defined as discussed below.

When a request is completed successfully by the completing device, the resulting completion status value is "Successful Completion" (encoded in the completion status field as "000" for this embodiment as indicated in Table 3). For example, a read request from a host bridge is routed through a switch to a completer endpoint. The Completer responds with a completion packet indicating a successful completion status and also responds with the data for the read request. The switch routes this completion packet back to the host bridge.

When a request is received and decoded by the completing device, but the completing device does not support the requested transaction and the request requires a completion, the resulting completion status is "Unsupported Request" (encoded in the completion status field as "001" for this embodiment as indicated in Table 3). One example of an unsupported request would be a memory read request to an out-of-range address. In this case, the completer is not able to support the request and the requester is expecting a completion.

For the case where a request is received and decoded by the completing device and the completing device is unable to support the requested transaction and the requesting device in not expecting a completion, the resulting completion status is an unsupported request. Since the requesting device is not expecting a completion, the completion status is communicated to the requesting device via a message as described above in connection with FIG. 10. An example of an unsupported request where the requesting device is not expecting a completion is a memory write transaction to an out-of-range address. The communication of the completion status via a message may be implemented as an optional feature.

When a completing device receives and decodes a request, but the completing device is unable to respond due to an internal error, the resulting completion status is a "Completer Abort" (encoded in the completion status field as "100" for this embodiment).

When a completing device receives a packet that violates packet formation rules, the result is a "Malformed Packet." The completing device responds to this situation by transmitting a "Malformed Packet" error message that is routed to the requesting device. A switch that receives a malformed packet must, for this embodiment, route the packet to the upstream port if no other port can be positively identified as the intended destination port.

When a read completion has a completion status other than "Successful Completion," no data is returned with the completion packet. The read completion with the non-successful completion status is the last completion transmitted for the request. For example, a completer may split a read request into four parts for servicing and the second completion packet results in a completer abort completion status. The final two completion packets are not transmitted. The requesting device, once it receives the completion packet with the non-successful completion status, considers the request terminated and should not expect additional completion packets corresponding to that read request.

Figure 11:
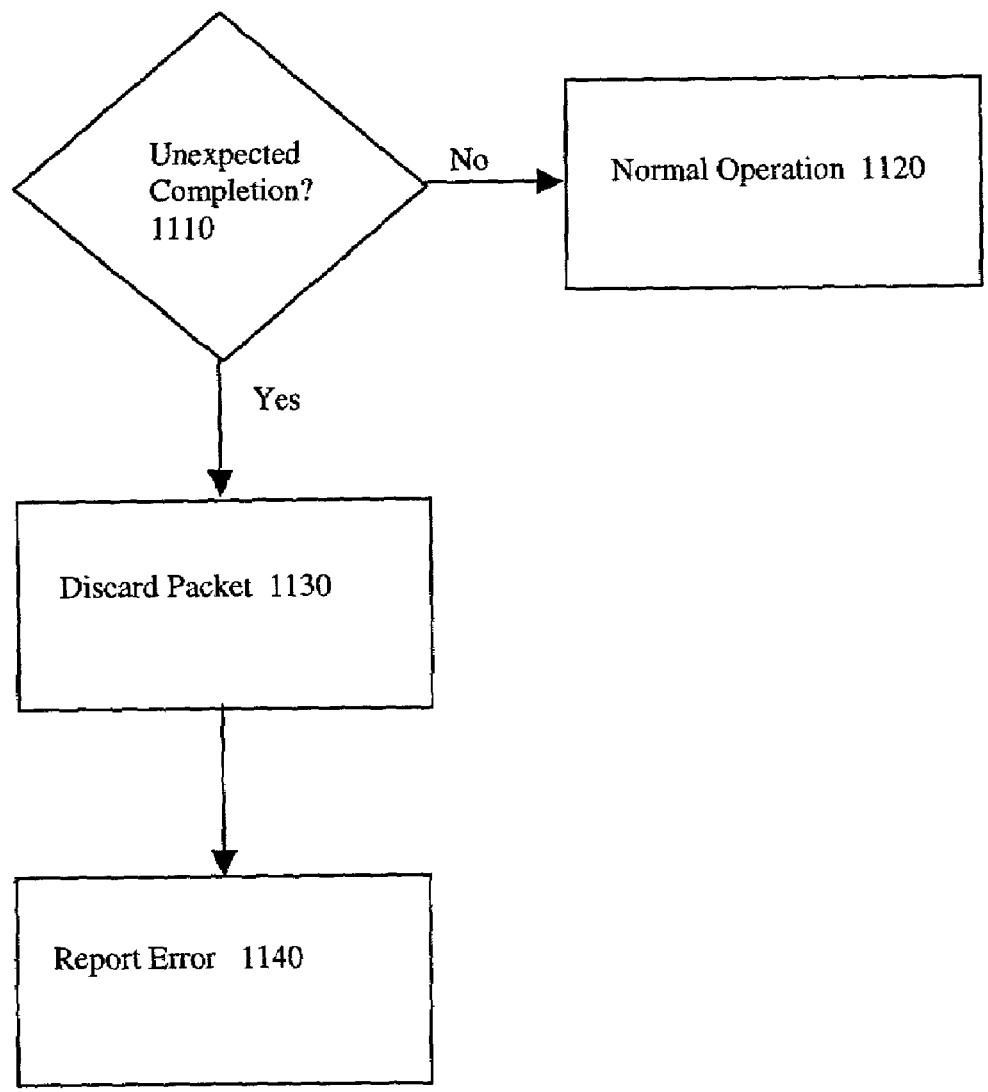
FIG. 11 is a flow diagram of one embodiment of a method for handling a completion packet that is not expected by a system agent.

FIG. 11 is a flow diagram of one embodiment of a method for handling a completion packet that is not expected by a system agent. An "unexpected completion" occurs when an agent receives a completion that does not correspond to any outstanding requests issued by that same agent. For the example method of FIG. 11, block 1110 indicates that if there is no unexpected completion then normal operation continues at block 1120. If, however, an unexpected completion is received, the unexpected completion packet is discarded at block 1130. After the packet is discarded, the above error condition may be reported to the system at block 1140. For this example embodiment, the reporting of the error may be an option that is programmable by software.

Figure 12:
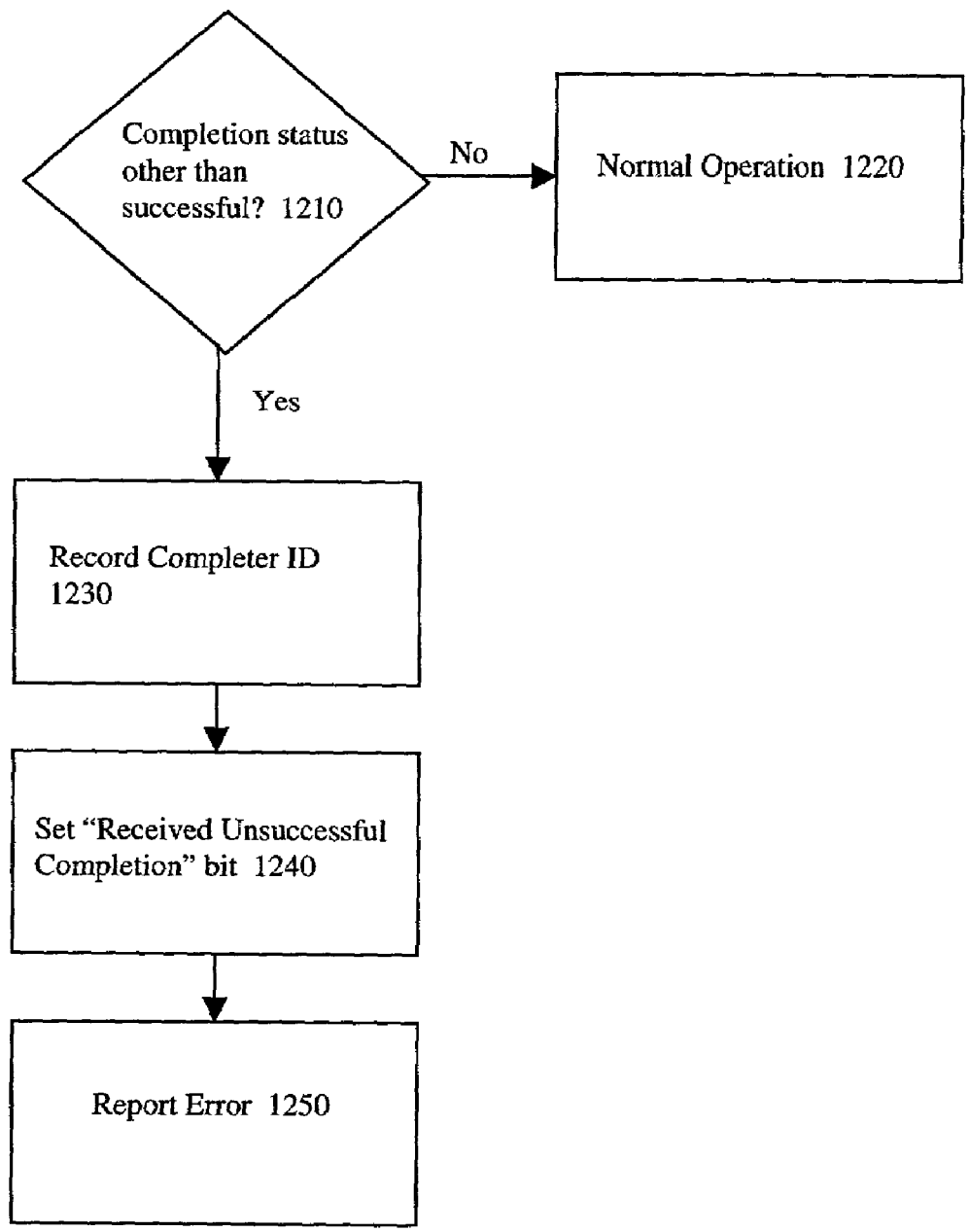
FIG. 12 is a flow diagram of one embodiment of a method for a requesting device handling a completion packet with a completion status other than "Successful Completion."

FIG. 12 is a flow diagram of one embodiment of a method for a requesting device handling a completion packet with a completion status other than "Successful Completion." Block 1210 indicates that if the completion status is "Successful Completion", then normal operation continues at block 1220. If the completion status is other than "Successful Completion", then at block 1230 the value of the Completer ID field is recorded. For this embodiment the Completer ID value is stored in a register. Then, at block 1240, a "Received Unsuccessful Completion" bit is set in a register in the requesting device for this embodiment. The above error condition may be reported at block 1250. The reporting of the error condition may be implemented as a programmable option. A software agent may use the Completer ID value and the "Received Unsuccessful Completion" bit to track down the source of the error condition.

Figure 13:
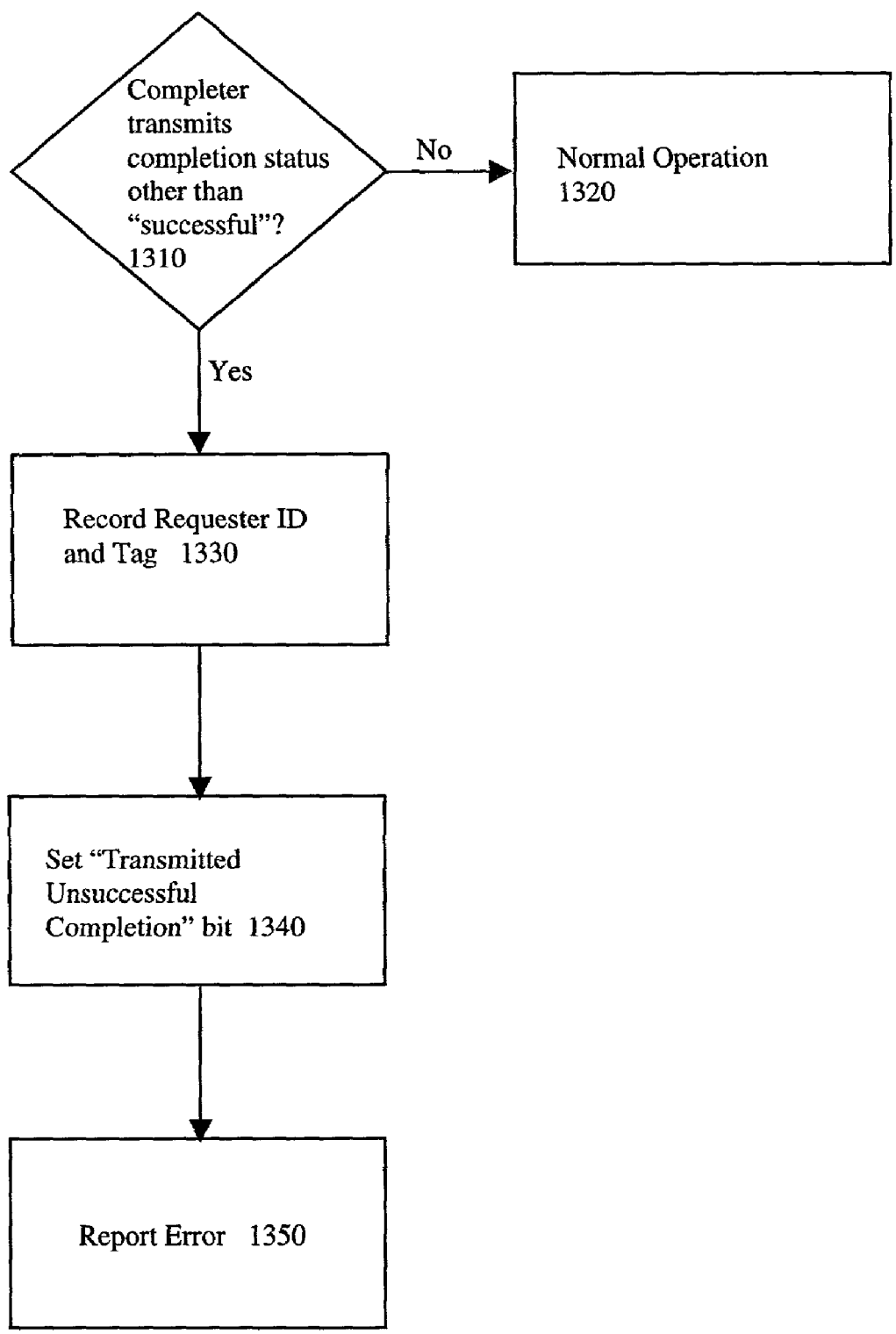
FIG. 13 is a flow diagram of one embodiment of a method for a completing device handling a completion packet with a completion status other than "Successful Completion."

FIG. 13 is a flow diagram of one embodiment of a method for a completing device handling a completion packet with a completion status other than "Successful Completion." Block 1310 indicates that if the completion status of a transmitted completion packet is "Successful Completion", then normal operation continues at block 1320. If the completion status is other than "Successful Completion", then at block 1330 the value of the Requester ID and Tag fields are recorded. For this embodiment, the Requester ID and Tag values are stored in one or more registers. Then, at block 1340, a "Transmitted Unsuccessful Completion" bit is set in a register in the completing device for this embodiment. The above error condition may be reported at block 1350. The reporting of the error condition may be implemented as a programmable option. A software agent may use the Requester ID and Tag values and the "Transmitted Unsuccessful Completion" bit to track down the source of the error condition.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than in a restrictive sense.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

What is claimed is:

1. An apparatus to communicate on a point-to-point communication link, the apparatus comprising:
a general input/output port to implement a communication stack including a physical layer, a data link layer and a transaction layer, the transaction layer to disassemble a packet for a request transaction from a transmitting device on the point to point communication link that does not expect a completion packet for the request transaction, wherein a message is sent to the transmitting device if the request transaction is unsuccessful.

2. The apparatus of claim 1, the packet for the request transaction including a packet header that includes a requester identification field that identifies the transmitting device.

3. The apparatus of claim 2, the contents of the requester identification field used to route the message back to the transmitting device.

4. The apparatus of claim 3, the message including an unsupported request error message.

5. A system to communicate on one or more point-to-point communication links, the system comprising:

a transmitting device to transmit a packet for a request transaction, the packet to be transmitted on a point-to-point communication link, the transmitting device to not expect an a completion packet for the request transaction; and
a receiving device to receive the packet for the request transaction on the point-to-point communication link, the receiving device to include a general input/output port to implement a communication stack including a physical layer, a data link layer and a transaction layer, the transaction layer to disassemble the packet for the request transaction, wherein the receiving device is to return a message to the transmitting device if the request transaction is unsuccessful.

6. The system of claim 5, the packet for the request transaction including a packet header that includes a requester identification field that identifies the transmitting device.

7. The system of claim 6, the contents of the requester identification field used to route the message back to the transmitting device.

8. The system of claim 7, the message including an unsupported request error message.

9. A method to communicate on a point-to-point communication link, the method comprising:
receiving at a general input/output port for a completing device a packet for a request transaction, the packet received from a transmitting device that does not expect a completion packet for the request transaction;
implementing a communication stack at the general input/output port for the completing device, the communication stack including a physical layer, a data link layer and a transaction layer, the transaction layer to disassemble the packet for the request transaction;
determining whether an error condition associated with completion of the request transaction exists; and
if an error condition exists, delivering an error message to the transmitting device.

10. The method of claim 9, wherein the error message indicates an unsupported request.

11. A system to communicate on one or more point-to-point communication links, the system, comprising:
a requesting device to transmit a packet for a memory transaction over the one or more point-to-point communication links, the requesting device to not expect a completion packet for the memory transaction; and
a completing device to receive the packet for the memory transaction, the completing device to include a general input/output port to implement a communication stack including a physical layer, a data link layer and a transaction layer, the transaction layer to disassemble the packet for the memory transaction wherein the completing device is to return a message over the one or more point-to-point communication links to the requesting device if the memory transaction is unsuccessful.

12. The system of claim 11, the packet for the memory transaction including a packet header that includes a requester identification field that identifies the requesting device.

13. The system of claim 12, the contents of the requester identification field used to route the message back to the requesting device.

14. The system of claim 12, the message including an unsupported request error message.

15. The system of claim 11, the memory transaction including a memory write transaction.

* * * * *

UNITED STATES PATENT AND TRADEMARK OFFICE
CERTIFICATE OF CORRECTION

| | | |
|---|---|---|
| PATENT NO. | : 7,191,375 B2 | Page 1 of 1 |
| APPLICATION NO. | : 10/041040 | |
| DATED | : March 13, 2007 | |
| INVENTOR(S) | : Gary Solomon, David Harriman and Jasmin Ajanovic | |

It is certified that error appears in the above-identified patent and that said Letters Patent is hereby corrected as shown below:

(Column 12, line 4): In claim 5, please delete "an".

Signed and Sealed this

Sixteenth Day of October, 2007

JON W. DUDAS
*Director of the United States Patent and Trademark Office*